United States Patent
Hu et al.

(10) Patent No.: US 12,148,625 B2
(45) Date of Patent: Nov. 19, 2024

(54) METHODS TO PREVENT SURFACE CHARGE INDUCED CD-DEPENDENT ETCHING OF MATERIAL FORMED WITHIN FEATURES ON A PATTERNED SUBSTRATE

(71) Applicant: Tokyo Electron Limited, Tokyo (JP)

(72) Inventors: Shan Hu, Albany, NY (US); Henan Zhang, Albany, NY (US); Sangita Kumari, Albany, NY (US); Peter Delia, Albany, NY (US); Robert Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 17/946,609

(22) Filed: Sep. 16, 2022

(65) Prior Publication Data
US 2024/0096638 A1 Mar. 21, 2024

(51) Int. Cl.
*H01L 21/311* (2006.01)
*H01L 21/306* (2006.01)
*H01L 21/3213* (2006.01)

(52) U.S. Cl.
CPC .. *H01L 21/31111* (2013.01); *H01L 21/30604* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 3,979,241 A | 9/1976 | Maeda et al. | |
| 7,910,491 B2 | 3/2011 | Soo Kwon et al. | |
| 9,190,293 B2 | 11/2015 | Wang et al. | |
| 9,865,598 B1* | 1/2018 | Bi | H01L 21/31144 |
| 2006/0118522 A1* | 6/2006 | Ramachandran | G03F 7/426 216/88 |
| 2011/0159660 A1* | 6/2011 | Kang | H10B 12/318 216/17 |
| 2015/0206761 A1 | 7/2015 | Fucsko et al. | |
| 2018/0138053 A1 | 5/2018 | Yao et al. | |
| 2019/0189518 A1* | 6/2019 | Xu | H01L 29/66795 |
| 2020/0044073 A1* | 2/2020 | Huang | H01L 29/4966 |
| 2021/0265172 A1* | 8/2021 | Fu | H01L 21/76883 |
| 2022/0098485 A1 | 3/2022 | Vereecke | |

OTHER PUBLICATIONS

Hu et al., Wet Etch Process and Method to Provide Uniform Etching of Material Formed Within Features Having Different Critical Dimension (CD), U.S. Appl. No. 17/942,359, filed Sep. 12, 2022, 54 pgs.

(Continued)

*Primary Examiner* — Shamim Ahmed
(74) *Attorney, Agent, or Firm* — Egan, Enders & Huston LLP.

(57) ABSTRACT

Embodiments of a wet etch process and methods are disclosed herein to provide uniform wet etching of material formed within features (e.g., trenches, holes, slits, etc.), and on more planar areas of a patterned substrate, when a critical dimension (CD) of the features is relatively small compared to the more planar areas of the patterned substrate. In the present disclosure, uniform wet etching is provided by ensuring that wall surfaces adjacent to the material being etched exhibit a neutral surface charge when exposed to the etch solution used to etch the material.

22 Claims, 9 Drawing Sheets

(56) References Cited

OTHER PUBLICATIONS

Ueda, "Effect of Hydrophobicity and Surface Potential of Silicon on SiO2 Etching in Nonometer-Sized Narrow Spaces", Trans Tech Publications, 2021, 6 pgs.
Watanabe et al., "High Selectively (SiN/SiO2) Etching Using an Organic Solution Containing Anhydroud HF", Microelectronic Engineering, 2009, 1 pg.
Okuyama et al., "Impact of Electrostatic Effects on Wet Etching Phenomenon in Nanoscale Region", Trans Tech Publications, 2015, 5 pgs.
Polster et al., "The Electrical-Double Layer Revisted", Natural Sciences, Dec. 2021, 10 pgs.
Zubel et al., "Silicon Anisotropic Etching in Alkaline Solutions IV: The Effect of Organic and Inorganic Agents on Silicon Anisotropic Etching Process", Sensors and Actuators a Physical, Jan. 2001, 1 pg.
Microchemicals, "Wet-Chemical Etching of Silicon and Sio2", Anisotropic Etching of Silicon, Basics of Microstructuring, Obtained from Internet Jul. 12, 2022, 7 pgs.
Microchemicals, "Wet Chemical Etching—Basics", Basics of Microstructuring, Obtained from Internet Jul. 12, 2022, 8 pgs.
Virginia Semiconductor, "Wet-Chemical Etching and Cleaning of Silicon", Jan. 2003, 11 pgs.
Li et al., "Evaluation on Dispersion Behavior of the Aqueous Copper Nano-Suspensions", Journal of Colloid and Interface Science, Mar. 2007, 9 pgs.

\* cited by examiner

METHODS TO PREVENT SURFACE CHARGE INDUCED CD-DEPENDENT ETCHING OF MATERIAL FORMED WITHIN FEATURES ON A PATTERNED SUBSTRATE

BACKGROUND

The present disclosure relates to the processing of substrates. In particular, it provides methods to provide uniform wet etching of material formed within features having different critical dimensions (CD).

Semiconductor device formation typically involves a series of manufacturing techniques related to the formation, patterning, and removal of layers of material on a substrate. During routine semiconductor fabrication, various materials formed on a substrate may be removed by patterned etching, chemical-mechanical polishing, as well as other techniques. A variety of techniques are known for etching layers on a substrate, including plasma-based or vapor-phase etching (otherwise referred to as dry etching) and liquid based etching (otherwise referred to as wet etching).

Wet etching generally involves dispensing a chemical solution over the surface of a substrate or immersing the substrate in the chemical solution. The chemical solution (otherwise referred to herein as an etch solution) often contains a solvent and etchant chemical(s) designed to react with materials on the substrate surface and promote dissolution of the reaction products. As a result of exposure of the substrate surface to the etch solution, material is removed from the substrate. The composition and temperature of the etch solution may be controlled to control the etch rate, specificity, and residual material on the surface of the substrate post-etch.

As geometries of substrate structures continue to shrink and the types of structures evolve, the challenges of etching substrates have increased. One such challenge is CD-dependent etching of material formed within narrow features (such as, e.g., trenches, holes, slits, etc.). In many applications, features having different critical dimensions (CDs) may be formed across a substrate. When a wet etch process is utilized to remove material from within such features, the etch rate of the material within features having smaller CD differs from the etch rate of the material within features having larger CD and blanket areas of the substrate. This CD-dependent etching results in an uneven etch rate, and an uneven removal of material, across the substrate.

SUMMARY

The present disclosure provides various embodiments of processes and methods that provide uniform wet etching of material formed within features (e.g., trenches, holes, slits, etc.), and on more planar areas of a patterned substrate, when a critical dimension (CD) of the features is relatively small compared to the more planar areas of the patterned substrate. In the present disclosure, uniform wet etching is provided by ensuring that wall surfaces adjacent to the material being etched exhibit a neutral surface charge when exposed to the etch solution used to etch the material.

When an etch solution is used to remove the material formed within the features, the rate at which the material is removed from one or more of the features (i.e., the etch rate) may differ depending on a variety of factors, such as the CD of the features, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate across features of different CD and more planar areas of the patterned substrate is known in the art as CD-dependent etching.

When a patterned substrate is exposed to an etch solution containing negatively charge reactive ions (anions) and positively charged reactive ions (cations), the wall surface adjacent to the material being etched may attain a positive, negative or neutral surface charge, depending on the material composition of the wall surface and the pH of the etch solution. Wall surfaces exhibiting positive surface charge (e.g., a surface charge substantially greater than 0 mV) in the presence of the etch solution attract the anions and repel the cations within the etch solution. On the other hand, wall surfaces exhibiting negative surface charge (e.g., a surface charge substantially less than 0 mV) in the presence of the etch solution attract the cations and repel the anions within the etch solution. In either case, electrostatic forces between the charged wall surface and the reactive ions in the etch solution may change the local concentration of the anions/cations within the features, which in turn, may affect (increase or decrease) the etch rate within the features compared to the etch rate within more planar areas of the substrate. When the electrostatic forces between the reactive ions and the positively or negatively charged wall surface produce a difference in etch rate, the phenomenon is referred to as surface charge induced CD-dependent etching.

The present disclosure provides uniform wet etching of material, which is formed within features of different CD (or features having relatively small CD compared to more planar areas of a patterned substrate), by preventing surface charge induced CD-dependent etching within the features. In some embodiments, surface charge induced CD-dependent etching may be prevented by forming a relatively thin (e.g., a monolayer up to 5 nm thick) liner layer within the features before the features are filled with a material and the patterned substrate is exposed to an etch solution to etch the material deposited within the features. The liner layer may be formed by a depositing a material onto the wall surfaces of the plurality of features. Unlike the wall surfaces of the plurality of features, which may exhibit a positive or negative surface charge in the presence of the etch solution, the liner layer deposited within the features exhibits a neutral surface charge (e.g., a surface charge substantially equal to 0 mV) when exposed to the etch solution. The neutral surface charge provided by the liner layer reduces or eliminates the attractive force (or the repulsive force) to the reactive species utilized in the etch solution(s), thereby preventing surface charge induced CD-dependent etching within the features and providing uniform etch rates within the features and across the more planar areas of the patterned substrate.

Embodiments of the present disclosure may also prevent surface charge induced CD-dependent etching in other ways. In some embodiments, the etch solution may be selected to ensure that the liner layer (or the wall surfaces of the features) exhibit a neutral surface charge in the presence of the etch solution. For example, the pH may be adjusted and/or surfactant(s) may be added to the etch solution to adjust the surface potential of the liner layer (or the wall surfaces of the features) to ensure that the liner layer (or the wall surfaces of the features) exhibit a neutral surface charge in the presence of the etch solution. The pH adjustment and/or surfactant addition may be utilized with or without the liner layer described herein. By providing a liner layer (or wall surfaces), which exhibit a neutral surface charge in the presence of the etch solution, the present disclosure provides uniform wet etching of the material formed within the features and on the more planar areas of the patterned substrate.

According to a first embodiment, a method of etching is provided that utilizes the techniques described in the present disclosure. In some embodiments, the method may begin by providing a patterned substrate having a plurality of features, wherein a critical dimension (CD) of the plurality of features is small compared to more planar areas of the patterned substrate. Next, the method may include forming a liner layer within the plurality of features before the plurality of features is filled with a material to be etched, depositing the material to be etched within the plurality of features and on the more planar areas of the patterned substrate, and exposing the patterned substrate to an etch solution to etch the material deposited within the plurality of features and on the more planar areas of the patterned substrate. When exposed to the etch solution, the liner layer prevents surface charge induced CD-dependent etching within the plurality of features and enables the etch solution to provide uniform etching of the material formed within the plurality of features and across the more planar areas of the patterned substrate.

The etch solution used to etch the material may have a pH value. When exposed to the etch solution, the liner layer may exhibit a neutral surface charge substantially equal to 0 mV at the pH value of the etch solution. If wall surfaces of the plurality of features were exposed to the etch solution, instead of the liner layer, the wall surfaces of the plurality of features may exhibit a positive surface charge greater than 0 mV or a negative surface charge less than 0 mV at the pH value of the etch solution, which may cause the surface charge induced CD-dependent etching within the plurality of features. By providing a liner layer within the plurality of features, which exhibit a neutral surface charge in the presence of the etch solution, the method disclosed herein prevents surface charge induced CD-dependent etching within the plurality of features and provides uniform wet etching of the material formed within the features and on the more planar areas of the patterned substrate.

According to a second embodiment, another method of etching is provided that utilizes the techniques described in the present disclosure. Like the first embodiment, the method disclosed in the second embodiment may include providing a patterned substrate having a plurality of features, wherein a critical dimension (CD) of the plurality of features is small compared to more planar areas of the patterned substrate, forming a liner layer within the plurality of features before the plurality of features is filled with a material to be etched, depositing the material to be etched within the plurality of features and on the more planar areas of the patterned substrate, and exposing the patterned substrate to an etch solution to etch the material deposited within the plurality of features and on the more planar areas of the patterned substrate. As noted above, the etch solution used to etch the material may have a pH value. When the liner layer is exposed to the etch solution, the liner layer may exhibit a neutral surface charge substantially equal to 0 mV at the pH value of the etch solution. The neutral surface charge may prevent surface charge induced CD-dependent etching within the plurality of features and enable the etch solution to provide uniform etching of the material within the plurality of features and across the more planar areas of the patterned substrate.

A wide variety of materials and methods may be used to form the liner layer utilized in the methods described herein. In some embodiments, said forming the liner layer may include depositing a material onto wall surfaces of the plurality of features to form the liner layer, wherein a thickness of the material deposited onto the wall surfaces is less than or equal to 5 nm. The material deposited onto the wall surfaces of the plurality of features: (a) is not etched by the etch solution, and (b) exhibits electroneutrality at the pH value of the etch solution.

In other embodiments, said forming the liner layer may include forming a self-assembled monolayer (SAM) on the wall surfaces of the plurality of features to form the liner layer. The SAM may generally include one or more monolayers. Like the material deposited onto the wall surfaces, the SAM may exhibit electroneutrality at the pH value of the etch solution.

In some embodiments, the methods described herein may further include adjusting the pH value of the etch solution to ensure that the liner layer exhibits the neutral surface charge at the pH value of the etch solution. In other embodiments, the methods described herein may further include adding a surfactant to the etch solution to ensure that the liner layer exhibits the neutral surface charge at the pH value of the etch solution.

The techniques described herein may be utilized to prevent surface charge induced CD-dependent etching within a wide variety of features. For example, the methods described herein may prevent surface charge induced CD-dependent etching within features (e.g., trenches, holes, gaps and slits) having relatively small CD (e.g., less than 100 nm) compared to more planar areas of the substrate by forming a liner layer within the features that exhibits a neutral surface charge in the presence of the etch solution. The methods described herein may also be used to prevent surface charge induced CD-dependent etching within other features formed within a patterned substrate.

In some embodiments, the methods described herein may be used to prevent surface charge induced CD-dependent etching within high aspect ratio features (such as deep trenches and holes) having an aspect ratio greater than 5 by forming the liner layer within the high aspect ratio features before the high aspect ratio features are filled with the material to be etched and the patterned substrate is exposed to the etch solution to etch the material deposited within the high aspect ratio features. In such embodiments, the liner layer described herein may prevent surface charge induced CD-dependent etching within the high aspect ratio features and enable the etch solution to provide a uniform etch rate of the material along a target etch depth of the high aspect ratio features.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides various embodiments of a wet etch process and method to provide uniform etching of material, which is formed within features (such as, e.g., trenches, holes, slits, etc.) having different critical dimension (CD), or features having relatively small CD compared to more planar areas of a patterned substrate. When an etch solution is used to remove the material within the features, the rate at which the material is removed from one or more of the features (i.e., the etch rate) may differ depending on a variety of factors, such as the CD of the features, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate across features of different CD is known in the art as CD-dependent etching.

Figure 1A:
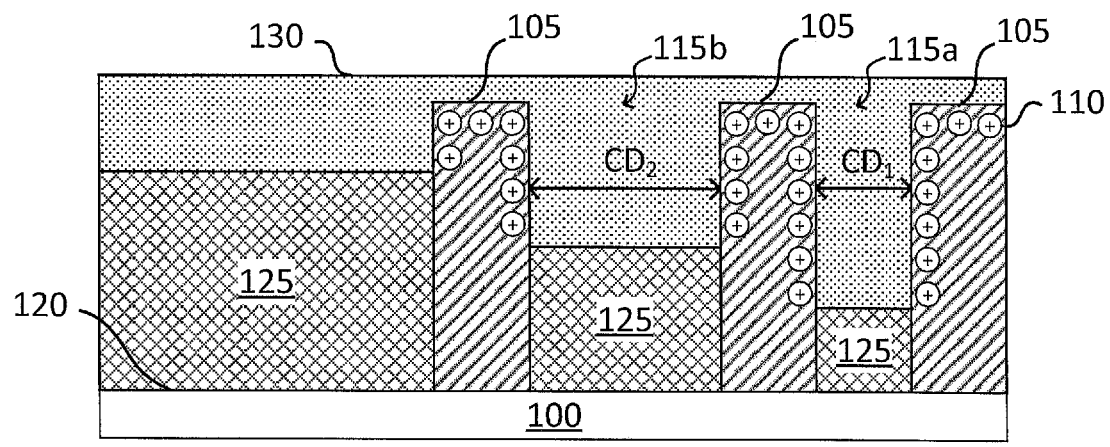
FIG. 1A is a cross-sectional view through a substrate having features of different critical dimension (CD) illustrating CD-dependent etching of material within the features when the substrate is exposed to a non-aqueous organic-based etch solution.
Figure 1B:
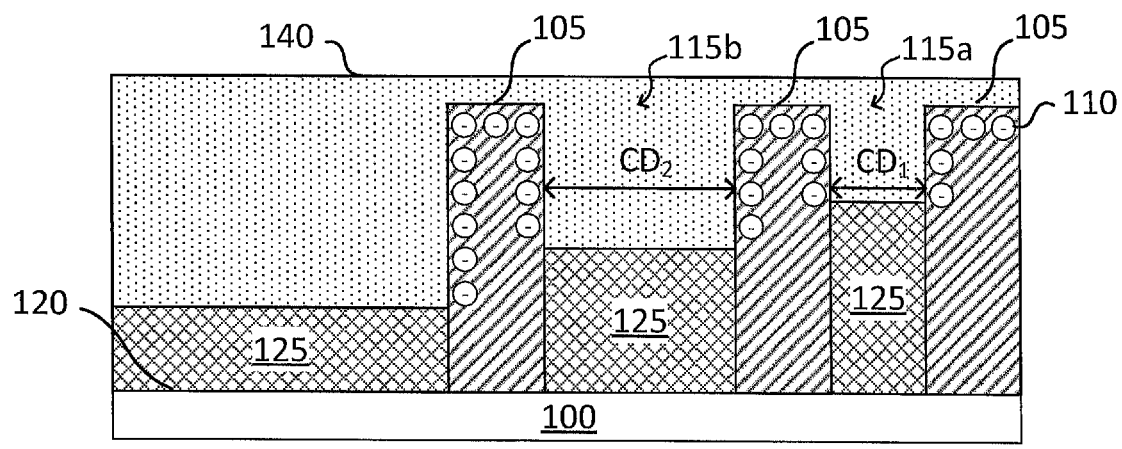
FIG. 1B is a cross-sectional view through a substrate having features of different critical dimension (CD) illustrating CD-dependent etching of material within the features when the substrate is exposed to an aqueous-based etch solution.
Figure 2:
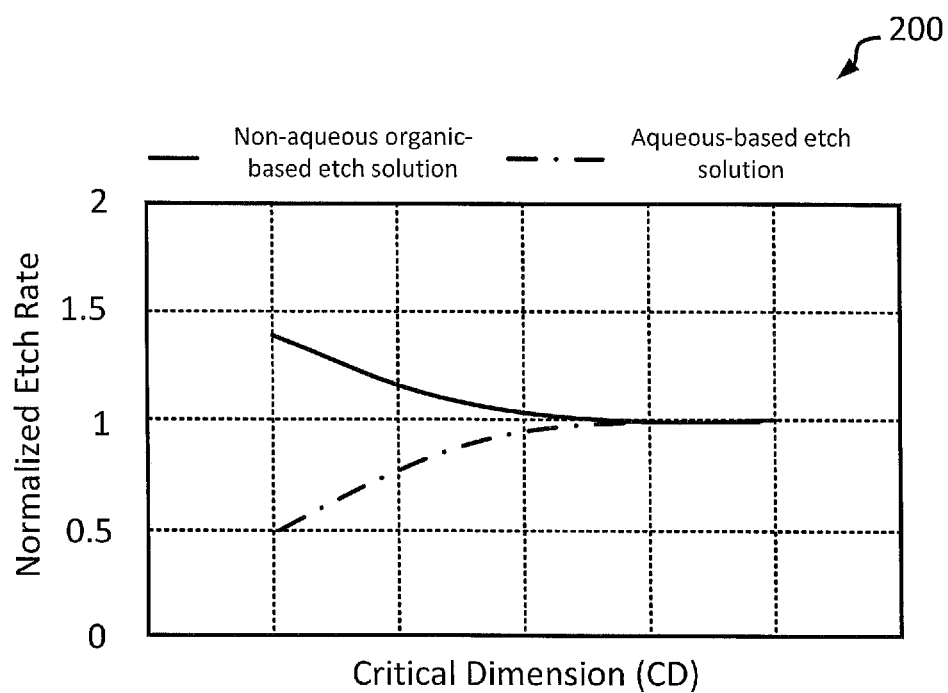
FIG. 2 is a graph illustrating normalized etch rate vs. feature CD when the substrate is exposed to a non-aqueous organic-based etch solution and an aqueous-based etch solution.

FIGS. 1A-1B and 2 illustrate CD-dependent etching of material deposited within features having different CD, and across more planar areas of a substrate, when the substrate is exposed to a non-aqueous organic-based etch solution 130 (FIGS. 1A and 2) and an aqueous-based etch solution 140 (FIGS. 1B and 2). As used herein, an aqueous-based etch solution 140 is a solution that includes one or more etchant chemicals mixed with an aqueous solvent (e.g., water ($H_2O$) or deionized water). A non-aqueous organic-based etch solution 130, on the other hand, is a solution that includes one or more etchant chemicals mixed with an organic solvent. In some embodiments, the non-aqueous organic-based etch solution 130 may include an etchant chemical that contains water (e.g., hydrofluoric acid (HF) containing for example 49% HF and 51% water, or ammonium hydroxide ($NH_4OH$) containing for example 29% $NH_4OH$ and 71% water, in terms of weight %) and thus, may include a minimal amount of water.

The substrate 100 shown in FIGS. 1A-1B is provided with a plurality of structures 105 (e.g., metal lines, fins, etc.) that extend above a surface of the substrate. Each of the plurality of structures 105 is separated by a feature 115 (such as, e.g., a gap, trench, hole, etc.). A critical dimension (CD) of the features 115 may be the same, or may be different, as shown in FIGS. 1A-1B. In the example embodiments shown in FIGS. 1A-1B, the substrate 100 is depicted as having a first feature 115a having a smaller CD ($CD_1$) and a second feature 115b having a larger CD ($CD_2$). The CD of the plurality of features 115 is relatively small (e.g., less than 100 nm) compared to the more planar areas 120 of the substrate 100 surrounding the plurality of structures 105.

A material 125 to be etched is deposited onto a surface of the substrate 100, the plurality of structures 105 and within the features 115 formed between the plurality of structures 105. The material 125 may include a wide variety of semiconductor materials. For example, the material 125 may be an oxide, a dielectric material, a silicon or a metal. In one example, the material 125 may be a silicon oxide (such as, e.g., silicon dioxide, $SiO_2$). Other oxide and dielectric materials, including low-k dielectric materials, may also be formed within the plurality of features 115 and etched.

In the embodiment shown in FIG. 1A, the substrate 100 is exposed to non-aqueous organic-based etch solution 130 that includes one or more etchant chemicals and an organic solvent. Examples of etchant chemicals that may be included within a non-aqueous organic-based etch solution 130 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

A wide variety of organic solvents may be used within the non-aqueous organic-based etch solution 130 described herein. Examples of organic solvents that may be included within the non-aqueous organic-based etch solution 130 include, but are not limited to, various alcohols (e.g., methanol ($CH_4O$), ethanol ($C_2H_6O$), isopropyl alcohol ($C_3H_8O$), benzyl alcohol ($C_7H_8O$), etc.), polyhydric alcohols (e.g., ethylene glycol ($C_2H_6O_2$) etc.), acetic acid ($CH_3COOH$), ketones (e.g., acetone ($C_3H_6O$), propylene carbonate ($C_4H_6O_3$), etc.), alkanes (e.g., n-hexane ($C_6H_{14}$), cyclohexane ($C_6H_{12}$), etc.), ethers (e.g., diethyl ether ($C_4H_{10}O$), tetrahydrofuran ($C_4H_8O$), etc.), aromatic hydrocarbons (e.g., benzene ($C_6H_6$), toluene ($C_7H_8$), etc.), halogen compounds (e.g., dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), etc.), nitrogen compounds (e.g., N-methyl-2-pyrrolidone ($C_5H_9NO$), etc.), sulfuric compounds (e.g., dimethyl sulfoxide ($C_2H_6OS$), etc.), and other volatile, carbon-based solvents such as ethyl lactate ($C_5H_{10}O_3$), ethanolamine ($C_2H_7NO$) and propylene glycol methyl ether acetate ($C_6H_{12}O_3$).

In some embodiments, the non-aqueous organic-based etch solution 130 may include an etchant chemical containing an anion as the main reactive species (e.g., hydrofluoric acid, ammonium hydroxide or hydrochloric acid) mixed with an alcohol (e.g., isopropyl alcohol, IPA), a polyhydric alcohol (e.g., ethylene glycol, EG), acetic acid, AA, or a ketone (e.g., propylene carbonate, PC). In at least one preferred embodiment, the non-aqueous organic-based etch solution 130 may include hydrofluoric acid mixed with IPA, AA, EG or PC. Other organic solvents described herein may also be mixed with hydrofluoric acid or other etchant chemicals (such as NH$_4$OH or HCl) containing an anion as the main reactive species. Although the etchant chemicals described herein can be mixed with many different organic solvents, the compatibility and solubility of the etchant chemical(s) and organic solvent must be carefully considered.

When the substrate 100 is exposed to a non-aqueous organic-based etch solution 130 containing anions as the main reactive species, portions of the features 115 exposed to the non-aqueous organic-based etch solution 130 may exhibit a positive surface potential, as shown in FIG. 1A, depending on the pH of the etch solution and the wall material 110 used to form the features 115. For example, exposed portions of the features 115 may exhibit a positive surface potential (as shown in FIG. 1A) when the substrate 100 is exposed to a non-aqueous organic-based etch solution 130 containing hydrofluoric acid mixed with an organic solvent (e.g., IPA, AA, EG or PC) and the wall material 110 includes a silicon-containing material, such as amorphous silicon (a-Si), polysilicon (poly-Si), silicon nitride (SiN), silicon carbon nitride (SiCN) or silicon oxynitride (SiON). In some cases, the exposed portions of the features 115 may also exhibit a positive surface potential when conductive wall materials 110, such as copper (Cu), aluminum (Al), etc., are exposed to a non-aqueous organic-based etch solution 130.

When the substrate 100 is exposed to a non-aqueous organic-based etch solution 130, as shown in FIG. 1A and described above, the anions within the etchant chemical are attracted to the positively charged surface. This increases the local concentration of anions within the features 115, which increases the etch rate of the material 125 deposited within the features 115 compared to the more planar areas 120 of the substrate 100. Thus, the material 125 is etched faster within the plurality of features 115 and slower within the more planar areas 120 of the substrate 100 surrounding the plurality of structures 105. This is shown schematically in FIG. 1A and in the graph 200 shown in FIG. 2. When features 115 of different CD are formed within the plurality of structures 105, as shown in FIG. 1A, the increase in etch rate is more pronounced within features having smaller CD (such as feature 115a) and less pronounced within features having larger CD (such as feature 115b). However, the etch rate within the features 115 is significantly faster than the etch rate achieved across the more planar areas 120 of the substrate 100.

In the embodiment shown in FIG. 1B, the substrate 100 is exposed to an aqueous-based etch solution 140 that includes one or more etchant chemicals and an aqueous solvent. As noted above, an aqueous-based etch solution 140 is a solution that includes an etchant chemical mixed with an aqueous solvent (e.g., water (H$_2$O) or deionized water). Examples of etchant chemicals that may be included within an aqueous-based etch solution 140 include, but are not limited to, hydrofluoric acid (HF), ammonium hydroxide (NH$_4$OH), hydrochloric acid (HCl), hydrogen peroxide (H$_2$O$_2$), nitric acid (HNO$_3$), phosphoric acid (H$_3$PO$_4$), potassium hydroxide (KOH), Tetramethylammonium hydroxide (TMAH) and other etchant chemicals containing an anion (negatively charged ion) as the main reactive species.

Figure 5:
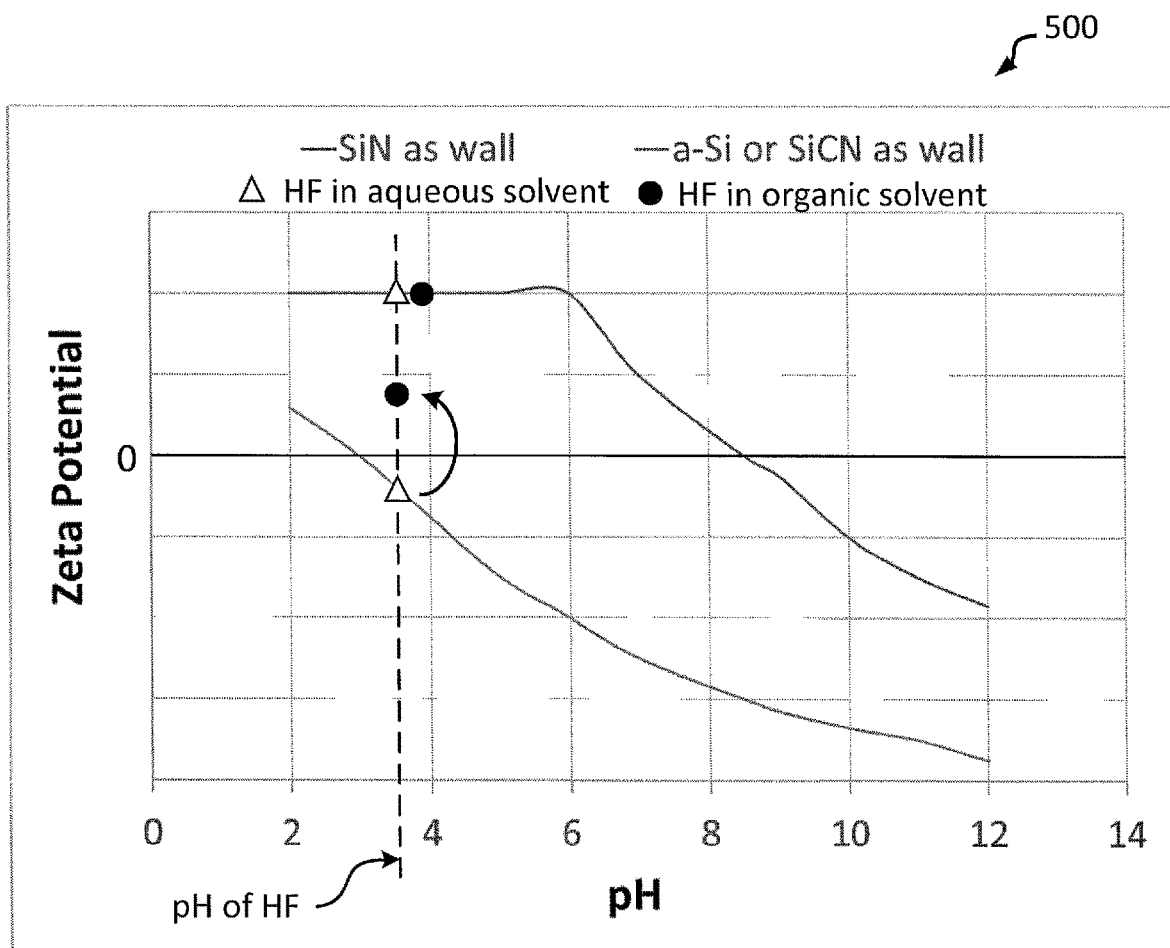
FIG. 5 is a graph illustrating Zeta potential vs pH for various etch solutions and wall materials.

When the substrate 100 is exposed to an aqueous-based etch solution 140 containing anions as the main reactive species, portions of the features 115 exposed to the aqueous-based etch solution 140 may exhibit a negative surface potential, as shown in FIG. 1B, depending on the pH of the etch solution and the wall material 110 used to form the features 115. For example, exposed portions of the features 115 may exhibit a negative surface potential (as shown in FIG. 1B) when the substrate 100 is exposed to an aqueous-based etch solution 140 containing hydrofluoric acid mixed with water and the wall material 110 includes a silicon-containing material (such as a-Si, poly-Si, SiCN or SiON) or a conductive material (such as Cu or Al). However, other silicon-containing materials, such as silicon nitride (SiN), may exhibit a positive surface potential (not shown in FIG. 1B) when the substrate 100 is exposed to an aqueous-based etch solution 140 containing hydrofluoric acid mixed with water. This is shown in FIG. 5 and described in more detail below.

When the substrate 100 is exposed to an aqueous-based etch solution 140, as shown in FIG. 1B and described above, the negative surface potential of the wall material 110 repels the anions within the etchant chemical to decrease its local concentration in the features 115, and thus, decrease the etch rate of the material 125 deposited within the features 115. When features 115 of different CD are formed within the plurality of structures 105, as shown in FIG. 1B, the decrease in etch rate is more pronounced in features having smaller CD (such as feature 115a) and less pronounced in features having larger CD (such as feature 115b). As a result, the material 125 is etched slower in features having smaller CD (such as feature 105a) and faster in features having larger CD (such as feature 105b). As shown in FIG. 1B, the etch rate across the more planar areas 120 of the substrate is significantly faster than the etch rate within the features 115.

When etching the material 125 formed within the plurality of features 115, the etch rate of the material 125 may depend on a variety of factors, including the critical dimension (CD) of the features 115, the particular etchant chemical(s) and/or reactive species used within the etch solution, the particular solvent used within the etch solution, the ratio of etchant chemical(s) to solvent used within the etch solution and/or the pH of the etch solution. In addition to these factors, the electric potential of the wall material 110 adjacent to the material 125 being etched may also affect the etch rate of the material 125, depending on the etch solution used.

As shown in FIGS. 1A-1B and 2, non-aqueous organic-based etch solutions 130 and aqueous-based etch solutions 140 may have the opposite effect on etch rate when anions are used as the main reactive species and the material being etched is adjacent to wall surfaces having a negative surface potential when exposed to aqueous solutions of certain pH. When the non-aqueous organic-based etch solution 130 shown in FIG. 1A is used to etch the material 125, the etch rate is increased within features of smaller CD (such as feature 115a) and decreased within features of larger CD (such as feature 115b). However, the opposite is true when the aqueous-based etch solution 140 shown in FIG. 1B is used to etch the material 125. This may be due, at least in part, to the Zeta potential and the electric double layer (EDL) that exists between the wall material 110 and the etch solution.

Figure 3:
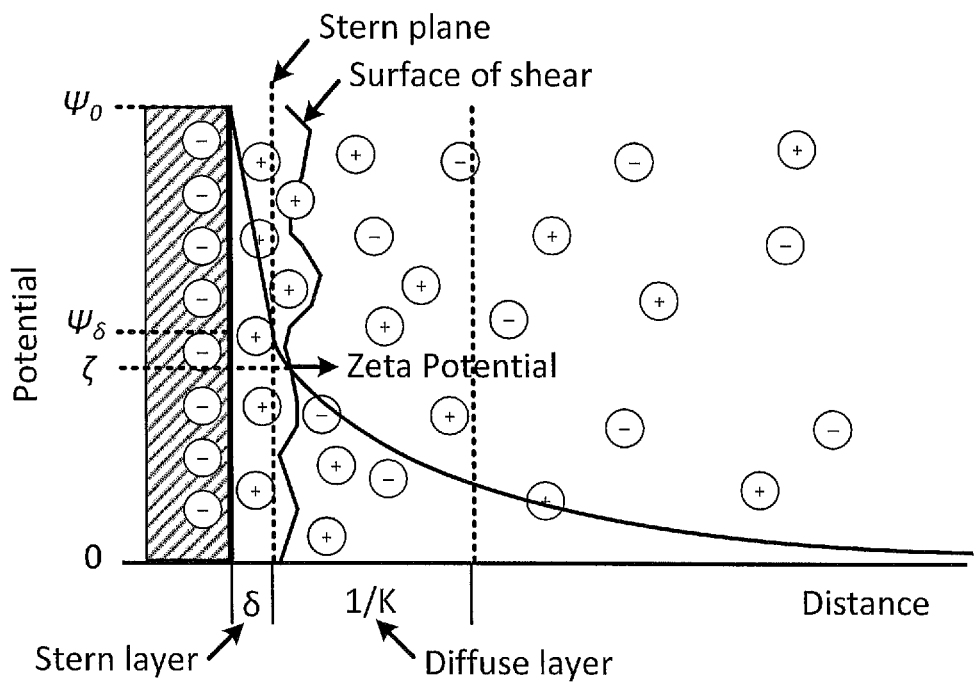
FIG. 3 is a schematic diagram illustrating the Zeta potential and the electric double layer (EDL) that exists between a charged wall surface and the etch solution.

FIG. 3 is a schematic diagram illustrating Zeta potential and the electric double layer that exists between the wall material and the etch solution. The etch solution includes cations (positively charged ions) and anions (negatively charged ions). When the etch solution comes in contact with a wall material having negative surface potential, as shown in FIG. 3, cations within the etch solution are attracted to and adsorbed onto the wall material by electrostatic and/or van der Walls forces. The opposite is true when the etch solution comes in contact with a wall material having positive surface potential (i.e., anions within the etch solution are attracted to and adsorbed onto the wall material). This attraction produces an electric double layer (i.e., a layer that does not satisfy electroneutrality) between the wall material and the etch solution.

According to the Stern model, the electric double layer (EDL) is divided into two parts separated by a plane, referred to as the Stern plane. The centers of adsorbed ions are located in the Stern layer between the wall surface and the Stern plane. Ions with centers located beyond the Stern plane form the Diffuse layer of the EDL. As shown in FIG. 3, the electric potential ($\psi$) near the wall surface changes linearly between $\psi_0$ and $\psi_\delta$ (the potential at the Stern plane) and decays exponentially with distance from $\psi_\delta$ to zero in the Diffuse layer and beyond. The Zeta potential ($\zeta$) is the electric potential that exists at the Surface of Shear between the charged wall surface and the etch solution. The Zeta potential ($\zeta$) may be positive, zero or negative, depending on the wall material and the pH of the etch solution.

Figure 4:
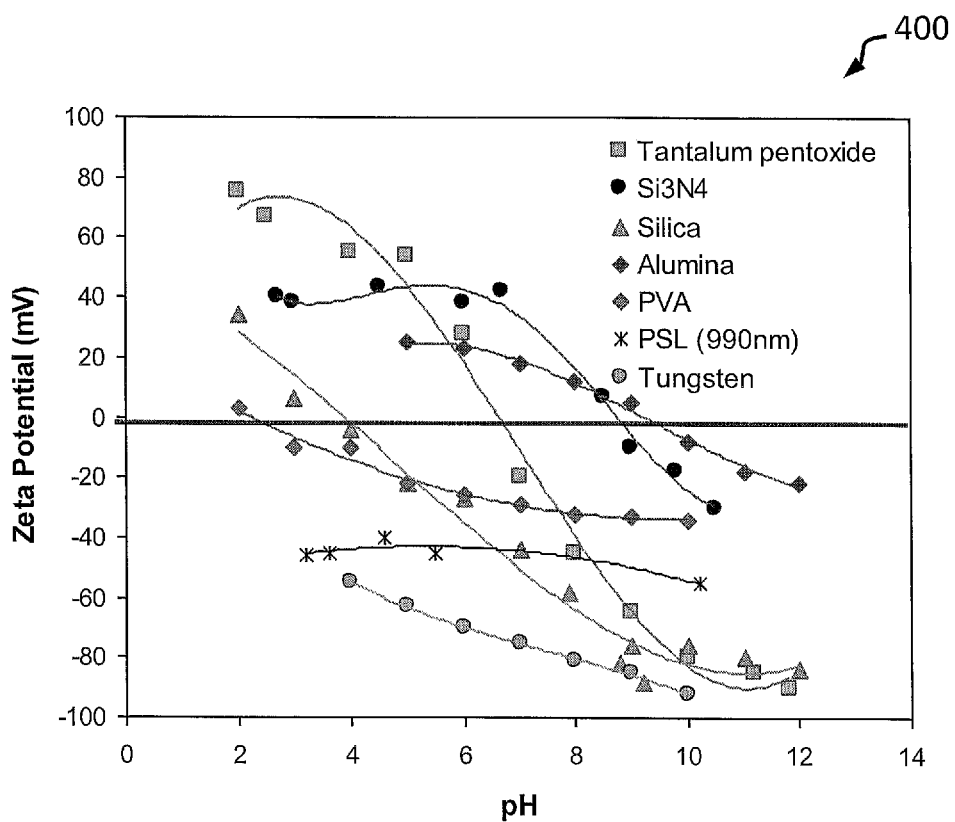
FIG. 4 is a graph illustrating Zeta potential vs pH for various wall materials.

FIG. 4 depicts a graph 400 illustrating Zeta potential (expressed in mV) vs pH for various wall materials. As shown in FIG. 4, the Zeta potential generally increases with decreasing pH and decreases with increasing pH. In some embodiments, the Zeta potential between the charged wall surface and the etch solution can be changed by changing the pH of the etch solution (e.g., by changing the etchant chemical(s) used within the etch solution, or by adding an acid or base to the etch solution), as shown in FIG. 4. In other embodiments, the Zeta potential between the charged wall surface and the etch solution can be changed by adding a surfactant to the etch solution. In yet other embodiments, the Zeta potential between the charged wall surface and the etch solution can be changed by utilizing an organic solvent, instead of an aqueous solvent, within the etch solution (depending on the pH of the etch solution). This is illustrated in the graph 500 shown in FIG. 5.

The graph 500 shown in FIG. 5 illustrates the Zeta potential vs pH for various etch solutions and wall materials (e.g., SiN, a-Si and SiCN). When hydrofluoric acid (HF) is mixed with an aqueous solvent and used as an etch solution, the Zeta potential (denoted with a A) between the etch solution and the wall material is: (a) negative for a-Si and SiCN (resulting in a negatively charged wall surface), and (b) positive for SiN (resulting in a positively charged wall surface). When hydrofluoric acid is mixed with organic solvent, instead of an aqueous solvent, the Zeta potential (denoted with a) is positive for a-Si, SiCN and SiN (resulting in positively charged wall surfaces). The graph 500 shown in FIG. 5 shows that, while organic solvents have little to no effect on the Zeta potential between an etch solution and an already positively charged wall surface, the Zeta potential between the etch solution and a negatively charged wall surface can (sometimes) be changed to a positive surface potential by using an organic solvent, instead of an aqueous solvent, within the etch solution. This difference in Zeta potential may explain, at least in part, the opposing effects that aqueous-based etch solutions and non-aqueous organic-based solutions may have on etch rate when: (a) the material being etched within the features is adjacent to a wall material having a negative surface charge in aqueous solutions of certain pH, and (b) the etchant chemical used within the etch solutions includes anions as the main reactive species.

Commonly assigned U.S. patent application Ser. No. 17/942,359, entitled "Wet Etch Process and Method to Provide Uniform Etching of Material Formed Within Features Having Different Critical Dimension (CD)," takes advantage of the difference in etch rate that occurs when non-aqueous organic-based etch solutions and aqueous-based etch solutions are used to etch a material formed within features of different CD, or features having relatively small CD compared to more planar areas of the patterned substrate. The commonly assigned patent application provides uniform etching within the features, regardless of CD, by combining etchant chemical(s), an organic solvent and an aqueous solvent within one or more etch solutions utilized within a wet etch process.

In the commonly assigned patent application, uniform etching is provided by tailoring the etch solution(s), not only to the material to be etched, but also to the wall material adjacent to the material to be etched and the Zeta potential (or surface charge) the wall material exhibits when exposed to aqueous solutions of certain pH. Because the etch rate within the features is dependent on the Zeta potential (or surface charge) of the wall material adjacent to the material being etched, the constituents of the etch solution(s) (i.e., the etchant chemical(s), organic solvent and aqueous solvent), and the ratios thereof, are selected in the commonly assigned patent application to increase the attractive force (or the repulsive force) to the reactive species utilized in the etch solution(s), thereby enhancing the effect of surface charge induced CD-dependent etching within the features.

The present disclosure provides an alternative wet etch process and methods to provide uniform wet etching of material formed within features of different CD, or features having relatively small CD compared to more planar areas of a patterned substrate. Unlike the wet etch process and methods disclosed in the commonly assigned patent application, which provide uniform wet etching of the material formed within the features by enhancing the effects of surface charge induced CD-dependent etching within the features, the wet etch process and methods disclosed herein provide uniform wet etching of the material formed within the features by preventing surface charge induced CD-dependent etching within the features.

In some embodiments of the present disclosure, surface charge induced CD-dependent etching is prevented by forming a relatively thin (e.g., a monolayer up to 5 nm thick) liner layer within the features before the features are filled with a material and the patterned substrate is exposed to an etch solution to etch the material deposited within the features. The liner layer may be formed by a depositing a material onto wall surfaces of the plurality of features. Unlike the wall surfaces of the plurality of features, which may exhibit a positive or negative surface charge in the presence of the etch solution, the liner layer deposited within the features exhibits a neutral surface charge (e.g., a surface charge substantially equal to 0 mV) when exposed to the etch solution. The neutral surface charge provided by the liner layer reduces or eliminates the attractive force (or the repulsive force) to the reactive species utilized in the etch solution(s), thereby preventing surface charge induced CD-dependent etching within the features and providing uniform etch rates within the features and across the more planar areas of the patterned substrate.

Embodiments of the present disclosure may also prevent surface charge induced CD-dependent etching in other ways. In some embodiments, the etch solution may be selected to ensure that the liner layer (or the wall surfaces of the features) exhibit a neutral surface charge in the presence of the etch solution. For example, the pH may be adjusted and/or surfactant(s) may be added to the etch solution to adjust the surface potential of the liner layer (or the wall surfaces of the features) to ensure that the liner layer (or the wall surfaces of the features) exhibit a neutral surface charge in the presence of the etch solution. The pH adjustment and/or surfactant addition may be utilized with or without the liner layer described herein. By providing a liner layer (or wall surfaces), which exhibit electroneutrality in the presence of the etch solution, the present disclosure provides uniform wet etching of the material formed within the features and on the more planar areas of the patterned substrate.

FIGS. 6A-6E illustrate one embodiment of a wet etch process 600 that may be used to provide uniform etch rate within a plurality of features by forming a relatively thin liner layer within the features before the features are filled with a material and the patterned substrate is exposed to an etch solution to etch the material deposited within the features. In some embodiments, the wet etch process 600 shown in FIGS. 6A-6E may be performed on a patterned substrate having features (e.g., trenches or holes) having different CD and/or a relatively small CD compared to more planar areas of the patterned substrate, such as the patterned substrate 100 shown in FIGS. 1A and 1B. In some embodiments, the wet etch process 600 shown in FIGS. 6A-6E may be performed on a patterned substrate having high aspect ratio features, such as deep trenches or holes. It is noted, however, that the wet etch process 600 shown in FIGS. 6A-6E is not strictly limited to the example substrate shown therein and may be applied to a wide variety of patterned substrates having a wide variety of features.

Figure 6A:
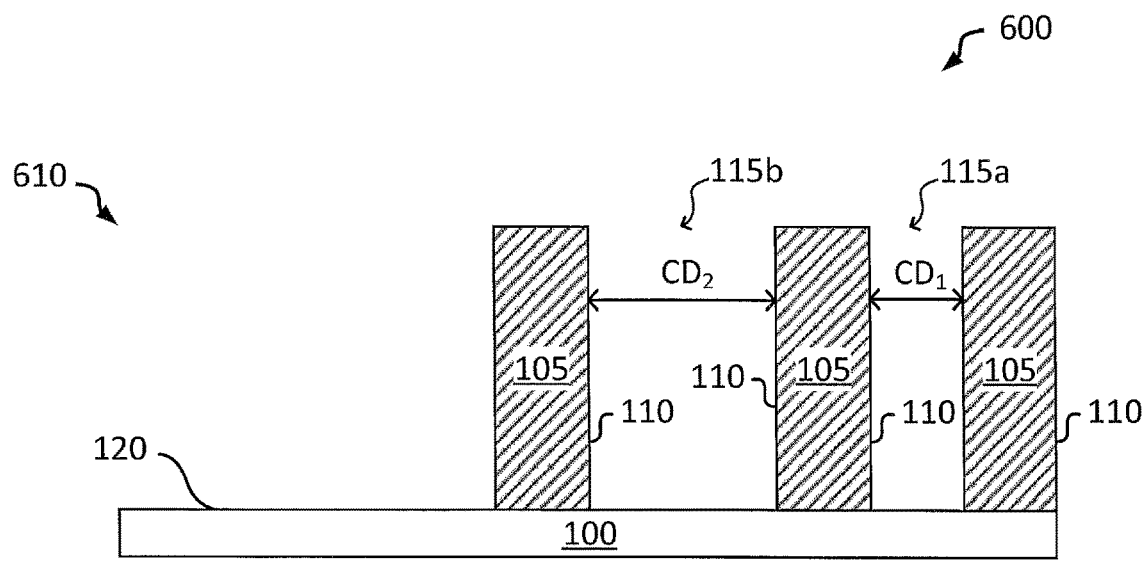
FIGS. 6A-6E illustrate one embodiment of an improved process that uses the techniques described herein to provide uniform wet etching of material formed within features and on more planar areas of a patterned substrate.

As shown in FIG. 6A, the wet etch process 600 may generally begin (in step 610) by providing a patterned substrate 100 having a plurality of features 115, where one or more of the features 115 have different CD and/or a relatively small CD compared to more planar areas 120 of the patterned substrate. In the example embodiment shown in FIG. 6A, the patterned substrate 100 is provided with a plurality of structures 105 (e.g., metal lines, fins, etc.) that extend above a surface of the substrate. Each of the plurality of structures 105 is separated by a feature 115 (such as, e.g., a gap, trench, hole, etc.) having a critical dimension (CD). Although the CD of the features 115 may be the same, the patterned substrate 100 is depicted in FIG. 6A as having a first feature 115a having a smaller CD ($CD_1$) and a second feature 115b having a larger CD ($CD_2$). The CD of the features 115 is relatively small (e.g., less than 100 nm) compared to the more planar areas 120 of the patterned substrate 100 surrounding the plurality of structures 105. In some embodiments, the features 115 formed within the patterned substrate 100 may be high aspect ratio features, such as deep trenches or holes. In such embodiments, an aspect ratio (AR=depth:CD) of the features 115 may be greater than or equal to 5.

As noted above with regard to FIGS. 1A and 1B, the wall material 110 used to form the features 115 may comprise a wide variety of materials including, but not limited to, silicon-containing materials (such as a-Si, poly-Si, SiCN or SiON) and conductive materials (such as Cu or Al). As further noted above, the wall material 110 may exhibit a positive surface charge greater than 0 mV (as shown in FIG. 1A) or a negative surface charge less than 0 mV (as shown in FIG. 1B) when exposed to various etch solutions, depending on the pH of the etch solution, the particular solvents utilized within the etch solution and the wall material 110 used to form the features 115 (as shown in FIGS. 4 and 5). When a charged surface is exposed to an etch solution containing reactive ions (e.g., anions and cations), electrostatic forces between the charged surface and the reactive ions in the etch solution may change the local concentration of the anions and cations within the features 115 and affect the etch rate within the features 115 compared to the etch rate within more planar areas 120 of the substrate, thus resulting in surface charge induced CD-dependent etching within the features 115.

Figure 6B:
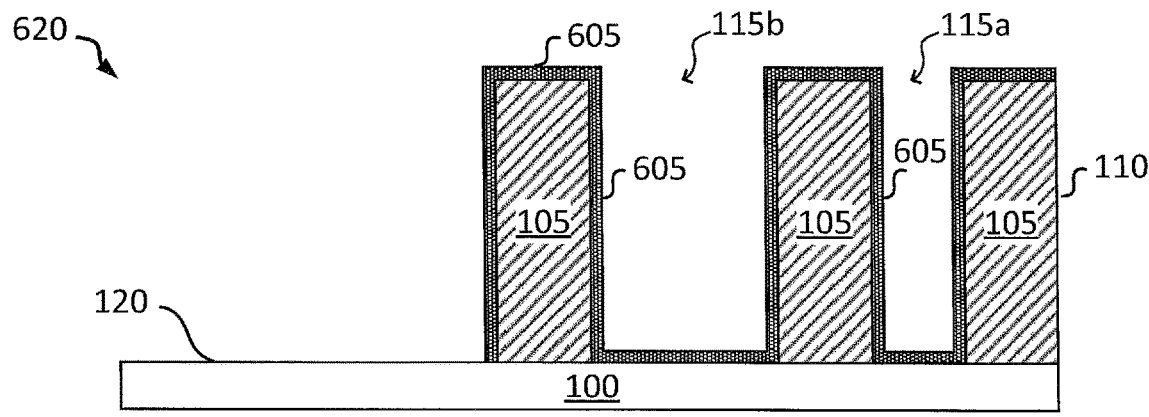

In some embodiments, the wet etch process 600 may prevent surface charge induced CD-dependent etching by forming a liner layer 605 on the plurality of structures 105 and within the plurality of features 115 (in step 620), as shown in FIG. 6B. The liner layer 605 is formed in FIG. 6B before the wet etch process 600 deposits a material 125 within the features 115 and on the more planar areas 120 of the patterned substrate 100 (in step 630 shown in FIG. 6C) and exposes the patterned substrate 100 to an etch solution 635 to etch the material 125 (in step 640 shown in FIG. 6D).

A wide variety of materials and methods may be used to form the liner layer 605 in FIG. 6B. In some embodiments, the liner layer 605 may be formed by conformally depositing a thin layer of material onto the wall material 110. A wide variety of semiconductor processes may be used to deposit the thin layer of material used to form the liner layer 605. For example, the thin layer of material may be deposited by spin-on, chemical vapor deposition (CVD), physical vapor deposition (PVD), etc. The thickness of the thin layer of material may generally be less than 5 nm, although other thicknesses may be utilized. In some embodiments, the liner layer 605 may be formed by forming a self-assembled monolayer (SAM) on the wall material 110. The SAM may include one or more monolayers.

The material composition of the liner layer 605 may depend on a variety of factors, including but not limited to, the etchant chemical and solvent(s) used within the etch solution 635 and the pH of etch solution 635. Although a wide variety of materials can be utilized, the material used to form the liner layer 605 is preferably one which: (a) is compatible with and not etched by the etch solution 635, (b) exhibits electroneutrality at the pH value of the etch solution 635, and (c) has no negative impact on the subsequently formed semiconductor device.

As used herein, a material that exhibits electroneutrality (or a neutral surface charge) when exposed to the etch solution 635 has a Zeta potential that is minimal at the pH value of the etch solution 635. In some cases, the Zeta potential of the material used to form the liner layer 606 may be substantially equal to 0 mV when exposed to the etch solution 635. As used herein, a Zeta potential "substantially equal to 0 mV" may fall within a first range comprising −20 mV to +20 mV, more preferably within a second range comprising −10 mV to +10 mV, and even more preferably within a third range comprising −5 mV to +5 mV. The graph 400 shown in FIG. 4 provides various examples of materials having a Zeta potential substantially equal to 0 mV at various pH. For example, silica (silicon dioxide, $SiO_2$) and polyvinyl alcohol (PVA) are illustrated in FIG. 4 as having a Zeta potential substantially equal to 0 mV when exposed to an etch solution having a pH value of 4. Other materials not explicitly shown and described herein may also exhibit a Zeta potential substantially equal to 0 mV when exposed to etch solutions having similar or different pH.

Figure 6C:
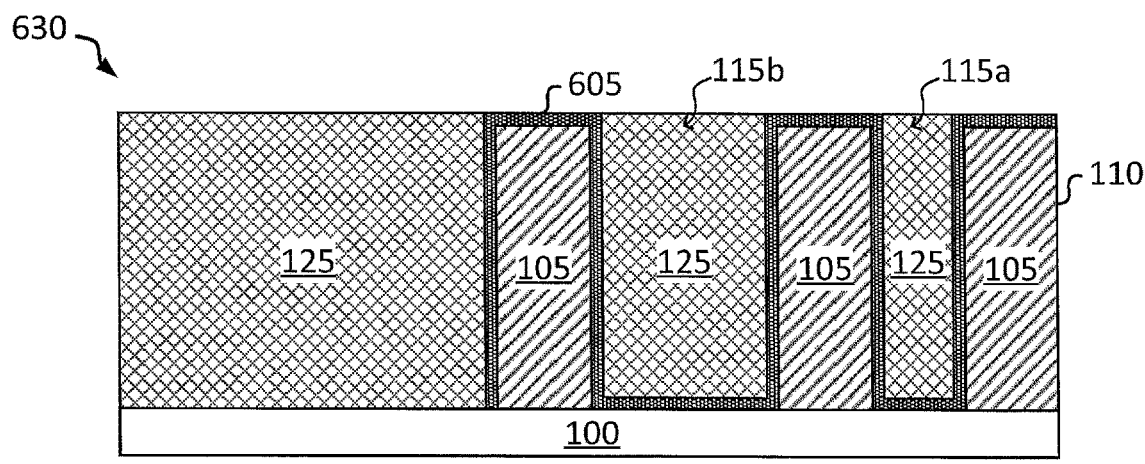

After the liner layer 605 is formed in FIG. 6B, the wet etch process 600 may deposit the material 125 within the features 115 and on the more planar areas 120 of the patterned substrate 100 (in step 630), as shown in FIG. 6C. A wide variety of semiconductor processes may be used to deposit the material 125. For example, the material 125 may be deposited by spin-on, chemical vapor deposition (CVD), physical vapor deposition (PVD), etc. As noted above, the material 125 may include a wide variety of semiconductor materials, such as but not limited to, an oxide, a dielectric material, a silicon or a metal. Unlike the liner layer 605, the material 125 deposited within the features 115 and on the more planar areas 120 of the patterned substrate 100 is one which is etched by the etch solution 635.

Figure 6D:
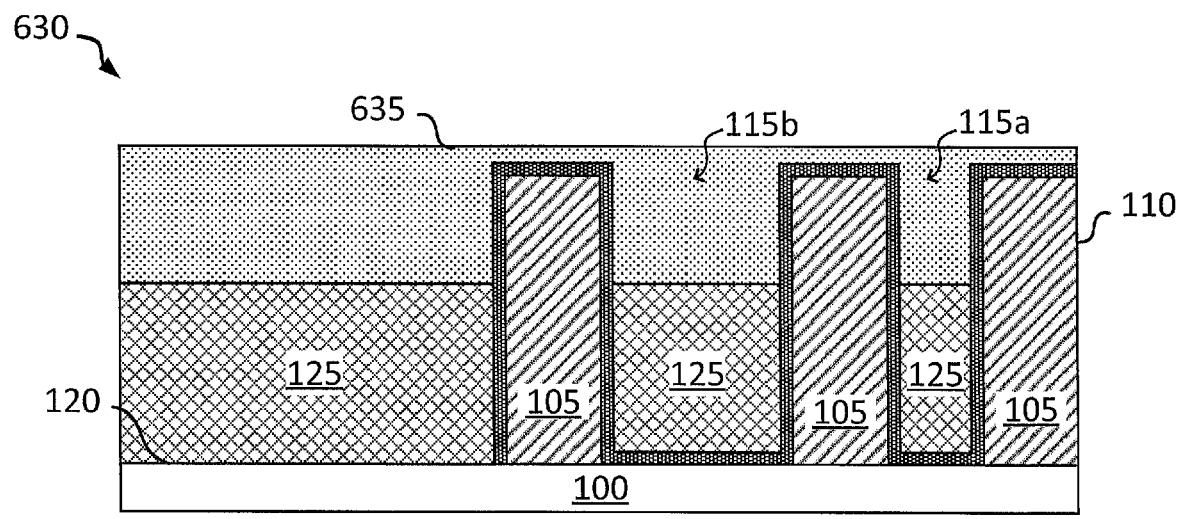

After the material 125 is deposited in FIG. 6C, the wet etch process 600 may expose the patterned substrate 100 to the etch solution 635 to etch the material 125 deposited within the features 115 and on the more planar areas 120 of the patterned substrate 100 (in step 640), as shown in FIG. 6D. A wide variety of etch solutions may be utilized to etch the material 125 including non-aqueous organic-based etch solutions 130, aqueous-based etch solutions 140 and etch solutions that combine etchant chemicals with organic and aqueous solvents. Although a wide variety of etch solutions may be utilized, the etch solution 635 may be chosen to selectively etch the material 125 without etching or removing the liner layer 605.

In some embodiments, the etch solution 635 used to selectively etch the material 125 may be predetermined, and a material composition of the liner layer 605 may be chosen to work with the etch solution 635. For example, the material composition of the liner layer 605 may be selected, so that the liner layer 605 exhibits the desired characteristics mentioned above (e.g., compatibility with, and substantially no surface charge within, the etch solution 635) when the liner layer 605 is exposed to the etch solution 635.

In other embodiments, the material composition of the liner layer 605 may be predetermined, and the etch solution 635 used to selectively etch the material 125 may be chosen to work with the liner layer 605. For example, the constituents of the etch solution 635 (i.e., the etchant chemical(s), organic solvent and aqueous solvent), and the ratios thereof, may be selected to selectively etch the material 125 without etching or removing the liner layer 605. The etch solution 635 may also be selected (or modified) to ensure that the liner layer 605 exhibits electroneutrality (or a neutral surface charge) in the presence of the etch solution 635. In some embodiments, the pH of the etch solution 635 may be adjusted and/or surfactant(s) may be added to the etch solution 635 to adjust the surface potential of the liner layer 605 and ensure that the liner layer 605 exhibits a neutral surface charge in the presence of the etch solution 635.

Unlike the wall material 110, which may exhibit a positive surface charge (e.g., a surface charge substantially greater than 0 mV) or a negative surface charge (e.g., a surface charge substantially less than 0 mV) in the presence of the etch solution 635, the liner layer 605 formed on the plurality of structures 105 and within the plurality of features 115 exhibits a neutral surface charge (e.g., a surface charge substantially equal to 0 mV) when exposed to the etch solution 635. When the liner layer 605 is exposed to the etch solution 635, as shown in step 630 of FIG. 6D, the neutral surface charge of the liner layer 605 reduces or eliminates electrostatic forces between the liner layer 605 and the reactive species utilized in the etch solution 635. This prevents surface charge induced CD-dependent etching within the features 115 and provides a uniform etch rate within the features 115 and across the more planar areas 120 of the patterned substrate 100.

Figure 6E:
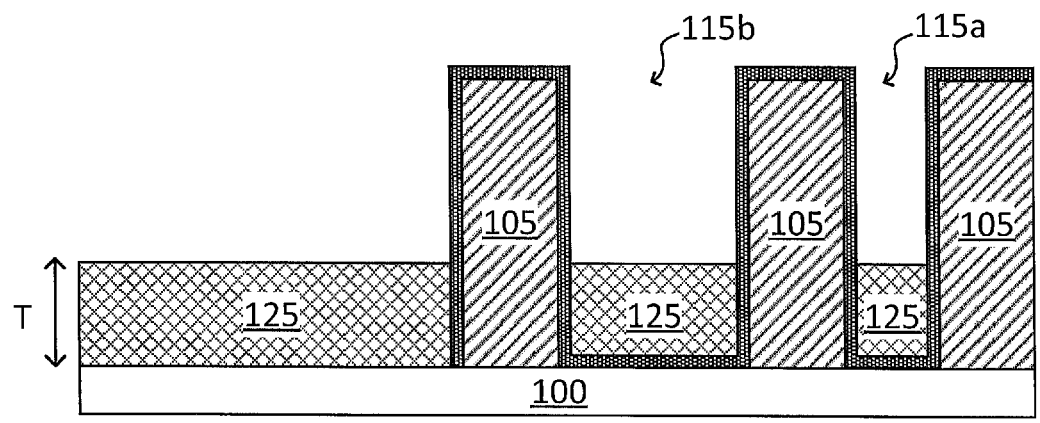

The wet etch process 600 shown in FIGS. 6A-6D provides uniform wet etching of material 125 formed within features 115 of different CD, or features 115 having relatively small CD compared to the more planar areas 120 of the patterned substrate 100, by utilizing a relatively thin liner layer 605 that exhibits electroneutrality (or a neutral surface charge) when exposed to the etch solution 635 used to etch the material 125. The neutral surface charge provided by the liner layer 605 prevents surface charge induced CD-dependent etching within the features 115, and in doing so, enables the etch solution 635 to provide uniform etching of the material 125. As a result, the post-etched material 125 may be provided with a uniform thickness (T) across the patterned substrate 100, as shown in FIG. 6E.

In the example embodiment shown in FIGS. 6A-6E, wet etch process 600 is used to provide uniform etching of material formed within trenches or holes of varying CD. In some embodiments, the wet etch process 600 shown in FIGS. 6A-6E may be used to provide uniform etching within deep trenches or holes having an aspect ratio greater than or equal to 5, such that a uniform etch rate is achieved along an etch depth of the deep trenches or holes. It is recognized, however, that the techniques described herein are not strictly limited to etching material formed within trenches or holes, and may be alternatively performed on any substrate having a wide variety of features, wherein the features have different CD, or relatively small CD compared to more planar areas of the patterned substrate.

The wet etch process 600 disclosed herein provides uniform etching of material within features formed on a patterned substrate. The wet etch process 600 disclosed herein may be utilized during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures, features and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow.

Figure 7:
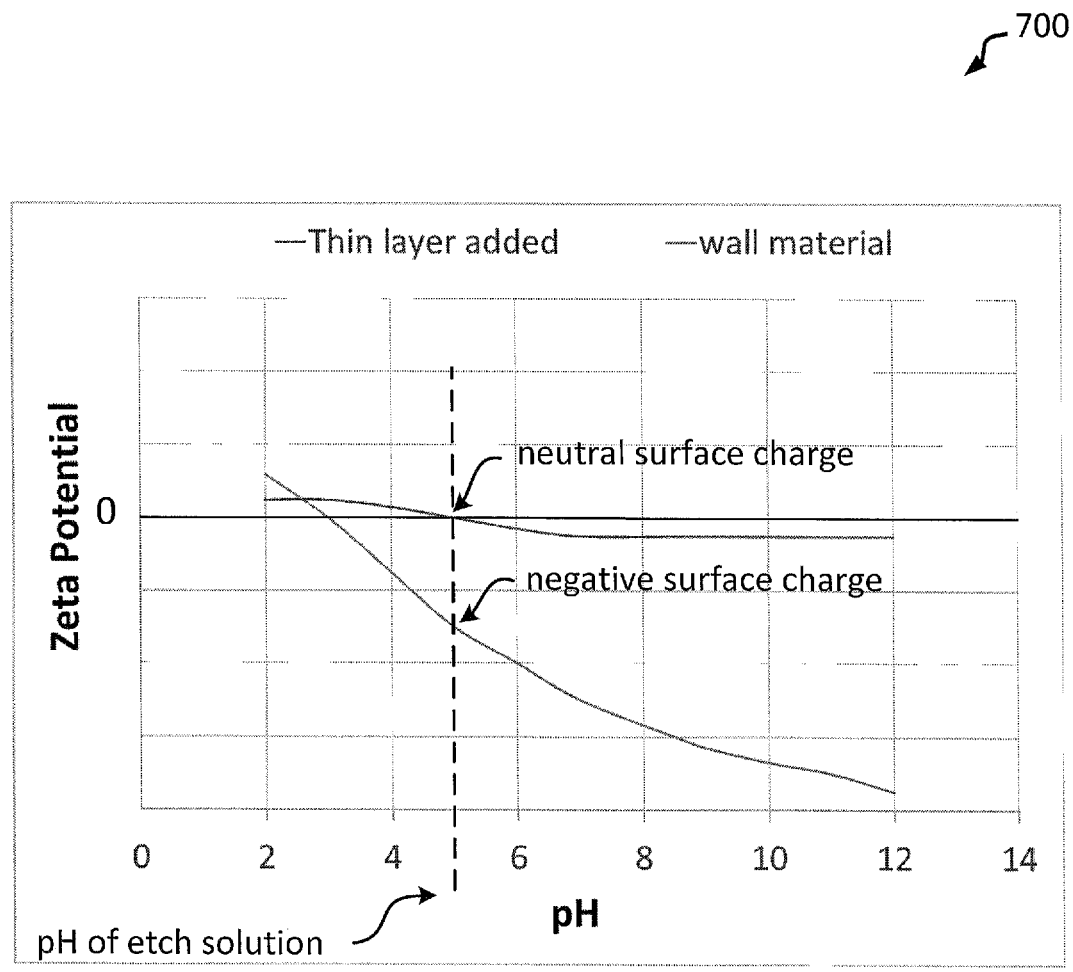
FIG. 7 is a graph illustrating Zeta potential vs pH for an example wall material and a thin liner layer, which is deposited onto the wall material to provide a wall surface that exhibits a neutral surface charge at the pH of the etch solution.

The graph 700 shown in FIG. 7 illustrates Zeta potential (expressed in mV) vs pH of the etch solution used to etch the material 125 for an example wall material 110, an example liner layer 605, and an example etch solution 635 having an example pH. Graph 700 shows that, if the wall material 110 were exposed to the etch solution 635 in FIG. 6B, the wall material 110 would exhibit a negative surface charge (e.g., a surface charge substantially less than 0 mV), which could affect (increase or decrease) the etch rate within the features 115 compared to the etch rate achieved in the more planar areas 120 of the patterned substrate 100. However, by adding a relatively thin (e.g., a monolayer up to 5 nm) liner layer 605 to the wall material 110, a wall surface having a neutral surface charge (e.g., a surface charge substantially equal to 0 mV) at the pH of the etch solution may be attained, as shown in FIG. 7. As noted above, an electrically neutral wall surface provides the benefits of: (a) reducing or eliminating electrostatic forces between the liner layer 605 and the reactive species utilized in the etch solution 635, (b) preventing surface charge induced CD-dependent etching within the features 115, and (c) providing a uniform etch rate within the features 115 and across the more planar areas 120 of the patterned substrate 100.

In some embodiments, the Zeta potential of the liner layer 605 may be substantially equal to 0 mV at the pH the etch solution 635, as shown for example in FIG. 7. However, this may not always be the case. In some embodiments, the Zeta potential of the liner layer 605 may be slightly more negative, or slightly more positive, than shown in FIG. 7. In such embodiments, the pH of the etch solution may be adjusted, and/or surfactants may be added, to adjust the Zeta potential of the liner layer 605 closer to 0 mV. In alternative embodiments, the liner layer 605 may be omitted and the pH of the etch solution may be adjusted, and/or surfactants may be added, to adjust the Zeta potential of the wall material 110 closer to 0 mV. In some embodiments, pH tuning and/or surfactant addition may enable the wall material 110 to attain a neutral surface charge (e.g., a surface charge substantially equal to 0 mV) in the presence of the etch solution 635.

Figure 8:
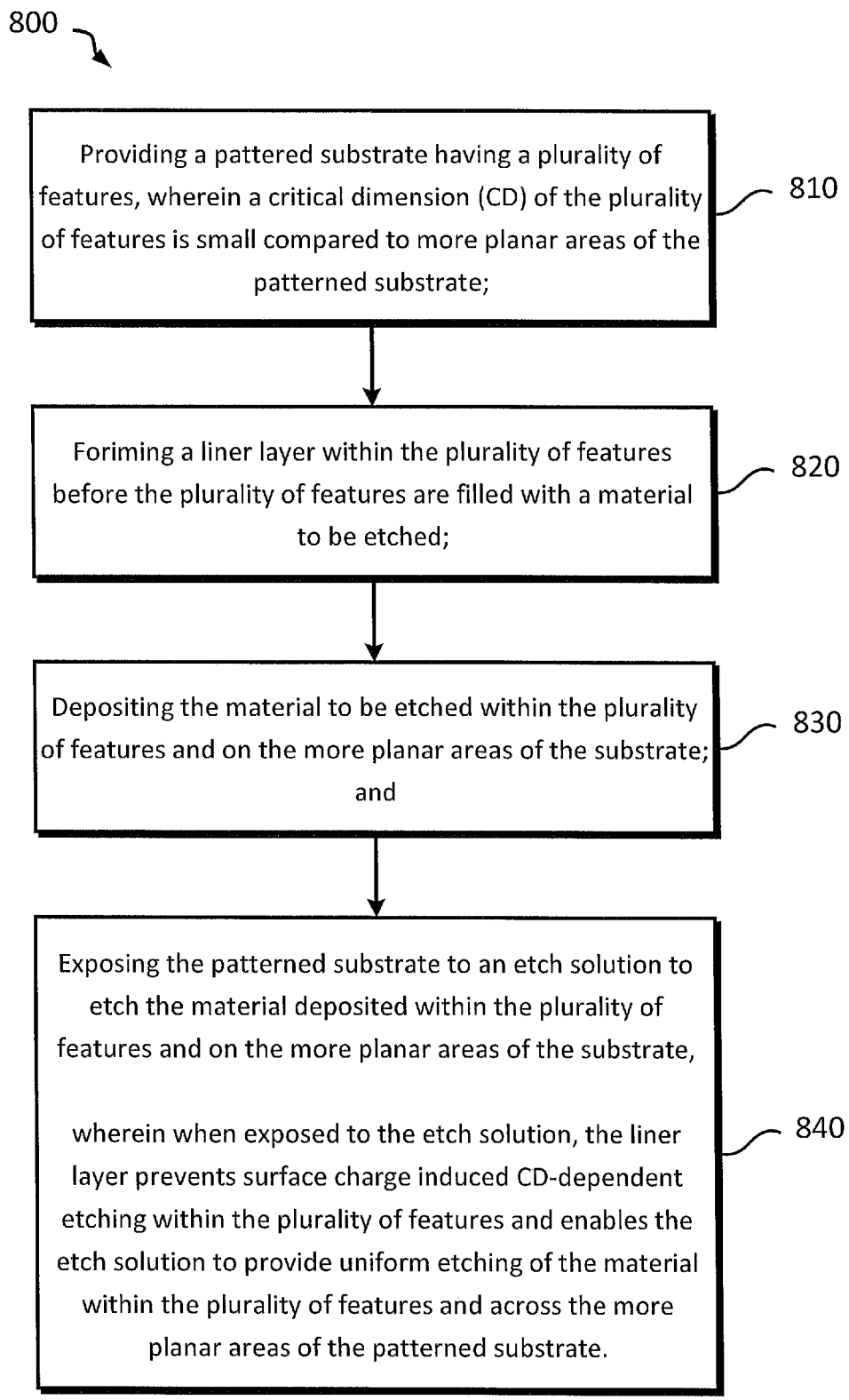
FIG. 8 is a flowchart diagram illustrating one embodiment of a method of etching that utilizes the techniques described herein.
Figure 9:
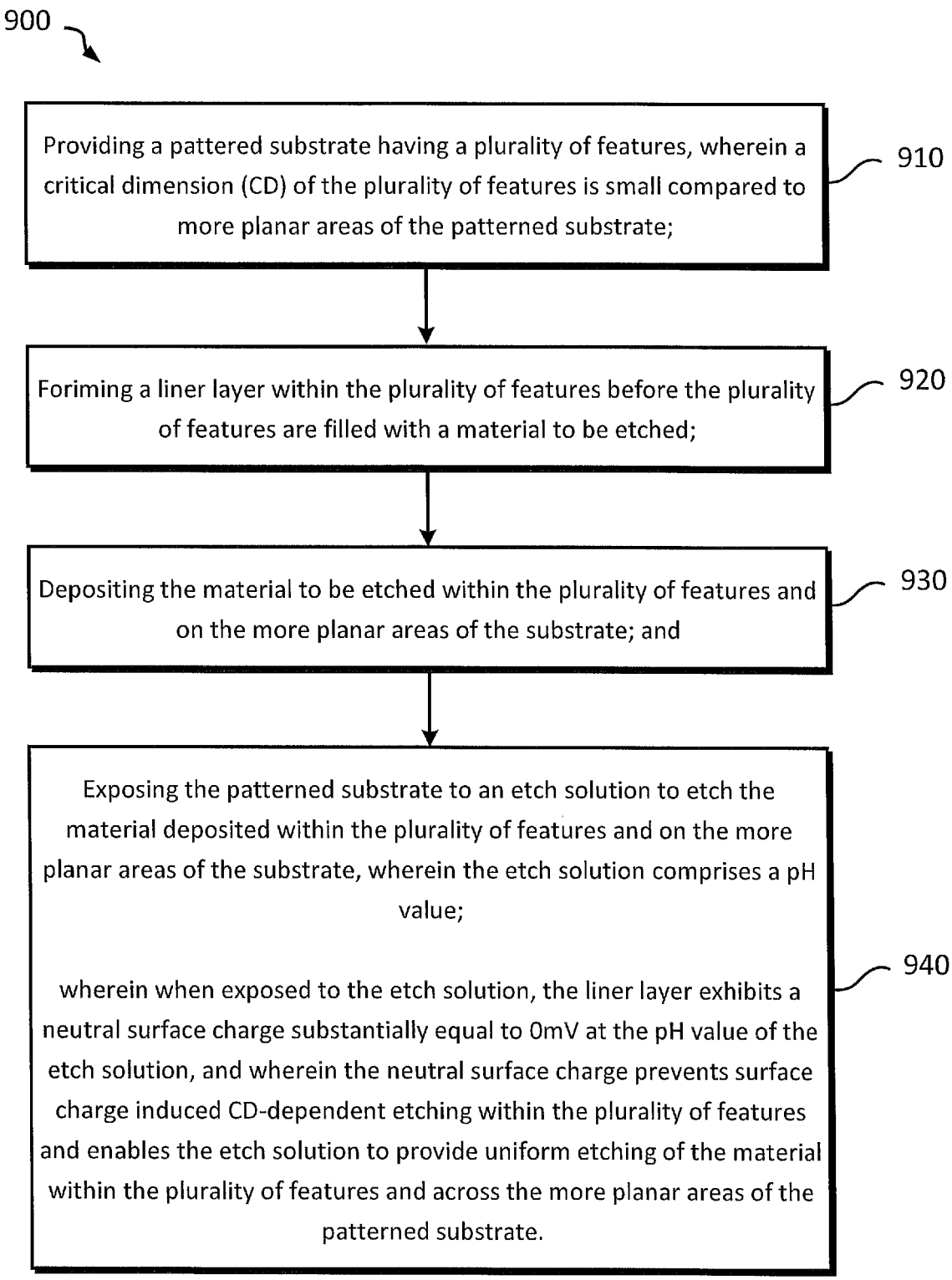
FIG. 9 is a flowchart diagram illustrating another embodiment of a method of etching that utilizes the techniques described herein.

FIGS. 8-9 illustrate exemplary methods that utilize the techniques described herein to provide uniform etching of material within features formed on a patterned substrate, such as but not limited to, the patterned substrate 100 shown in FIGS. 6A-6E. It will be recognized that the embodiments shown in FIGS. 8-9 are merely exemplary and additional methods may utilize the techniques described herein. Further, additional processing steps may be added to the methods shown in FIGS. 8-9 as the steps described are not intended to be exclusive. Moreover, the order of the steps is not limited to the order shown in the figures as different orders may occur and/or various steps may be performed in combination or at the same time.

FIG. 8 illustrates a method 800 of etching, in accordance with one embodiment of the present disclosure. In some embodiments, the method 800 shown in FIG. 8 may begin (in step 810) by providing a patterned substrate having a plurality of features, wherein a critical dimension (CD) of the plurality of features is small compared to more planar areas of the patterned substrate. Next, the method 800 may form a liner layer within the plurality of features before the plurality of features is filled with a material to be etched (in step 820) before depositing the material to be etched within the plurality of features and on the more planar areas of the patterned substrate (in step 830), and exposing the patterned substrate to an etch solution to etch the material deposited within the plurality of features and on the more planar areas of the patterned substrate (in step 840). When exposed to the etch solution (in step 840), the liner layer prevents surface charge induced CD-dependent etching within the plurality of features, and enables the etch solution provides uniform etching of the material formed within the plurality of features and across the more planar areas of the patterned substrate.

If wall surfaces of the plurality of features were exposed to the etch solution (in step 840), the wall surfaces of the plurality of features would exhibit a positive surface charge greater than 0 mV or a negative surface charge less than 0 mV at the pH value of the etch solution. The positive surface charge or negative surface charge may cause surface charge induced CD-dependent etching within the plurality of features by changing the local concentration of reactive ions within the features, thereby increasing or decreasing the etch rate within the features compared to the etch rate achieved in the more planar areas of the patterned substrate. However, by adding a liner layer (in step 820) onto the wall surfaces of the plurality of features, the method 800 shown in FIG. 8 provides a liner layer, which: (a) exhibits a neutral surface charge substantially equal to 0 mV at the pH value of the etch solution, and (b) does not affect the etch rate within the features.

FIG. 9 illustrates a method 900 of etching, in accordance with another embodiment of the present disclosure. Like the method 800 shown in FIG. 8, the method 900 shown in FIG. 9 may begin (in step 910) by providing a patterned substrate having a plurality of features, wherein a critical dimension (CD) of the plurality of features is small compared to more planar areas of the patterned substrate. Next, the method 900 may form a liner layer within the plurality of features before the plurality of features is filled with a material to be etched (in step 920) before depositing the material to be etched within the plurality of features and on the more planar areas of the patterned substrate (in step 930) and exposing the patterned substrate to an etch solution having a pH value to etch the material deposited within the plurality of features and on the more planar areas of the patterned substrate (in step 940). When exposed to the etch solution (in step 940), the liner layer exhibits a neutral surface charge substantially equal to 0 mV at the pH value of the etch solution. The neutral surface charge prevents surface charge induced CD-dependent etching within the plurality of features and enables the etch solution to provide uniform etching of the material within the plurality of features and across the more planar areas of the patterned substrate.

In some embodiments of the method 800 and the method 900, the liner layer may be formed (in steps 820 and 920) by depositing a material onto the wall surfaces of the plurality of features. In some embodiments, a thickness of the material deposited onto the wall surfaces may be less than or equal to 5 nm. Although a wide variety of materials may be utilized, the material deposited onto the wall surfaces is preferably one, which: (a) is compatible with and not etched by the etch solution, and (b) exhibits electroneutrality at the pH value of the etch solution.

In some embodiments of the method 800 and the method 900, the liner layer may be formed (in steps 820 and 920) by forming a self-assembled monolayer (SAM) on the wall surfaces of the plurality of features. The SAM may generally include one or more monolayers. Like the material disclosed above, the SAM may exhibit electroneutrality at the pH value of the etch solution.

In some embodiments, the method 800 and/or the method 900 may further include adjusting the pH value of the etch solution to ensure that the liner layer exhibits the neutral surface charge at the pH value of the etch solution. In other embodiments, the method 800 and/or the method 900 may further include adding a surfactant to the etch solution to ensure that the liner layer exhibits the neutral surface charge at the pH value of the etch solution.

The techniques described herein may be utilized to prevent surface charge induced CD-dependent etching within a wide variety of features. For example, the method 800 and the method 900 may prevent surface charge induced CD-dependent etching within features (e.g., trenches, holes, gaps and slits) having relatively small CD (e.g., less than 100 nm) compared to more planar areas of the substrate by forming a liner layer within the features that exhibits a neutral surface charge in the presence of the etch solution. The method 800 and the method 900 may also be used to prevent surface charge induced CD-dependent etching within other features formed within a patterned substrate.

In some embodiments, the method 800 and/or the method 900 may be used to prevent surface charge induced CD-dependent etching within high aspect ratio features (such as deep trenches and holes) having an aspect ratio greater than 5 by forming the liner layer within the high aspect ratio features before the high aspect ratio features are filled with the material to be etched and the patterned substrate is exposed to the etch solution to etch the material deposited within the high aspect ratio features. In such embodiments, the liner layer described herein may prevent surface charge induced CD-dependent etching within the high aspect ratio features and enable the etch solution to provide a uniform etch rate of the material along a target etch depth of the high aspect ratio features.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures, features or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Wet etch processes and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described wet etch processes and methods will be apparent to those skilled in the art in view of this description. It will be recognized, therefore, that the described wet etch processes and methods are not limited by the examples described herein. It is to be understood that the forms of the processes and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:
   providing a patterned substrate having a plurality of features, wherein a critical dimension (CD) of the plurality of features is small compared to more planar areas of the patterned substrate;
   forming a liner layer within the plurality of features before the plurality of features is filled with a material to be etched;
   depositing the material to be etched within the plurality of features and on the more planar areas of the patterned substrate; and
   exposing the patterned substrate to an etch solution to etch the material deposited within the plurality of features and on the more planar areas of the patterned substrate;
   wherein when exposed to the etch solution, the liner layer prevents surface charge induced CD-dependent etching of the material deposited within the plurality of features and enables the etch solution to etch the material deposited within the plurality of features and across the more planar areas of the patterned substrate at a uniform etch rate.

2. The method of claim 1, wherein the etch solution comprises a pH value, and wherein when exposed to the etch solution, the liner layer exhibits a neutral surface charge substantially equal to 0 mV at the pH value of the etch solution.

3. The method of claim 2, wherein if wall surfaces of the plurality of features were exposed to the etch solution, the wall surfaces of the plurality of features would exhibit a positive surface charge greater than 0 mV or a negative surface charge less than 0 mV at the pH value of the etch solution, which would cause the surface charge induced CD-dependent etching within the plurality of features.

4. The method of claim 2, wherein said forming the liner layer comprises depositing a material onto wall surfaces of the plurality of features to form the liner layer.

5. The method of claim 4, wherein a thickness of the material deposited onto the wall surfaces is less than or equal to 5 nm.

6. The method of claim 4, wherein the material deposited onto the wall surfaces is not etched by the etch solution.

7. The method of claim 4, wherein the material deposited onto the wall surfaces exhibits electroneutrality at the pH value of the etch solution.

8. The method of claim 2, wherein said forming the liner layer comprises forming a self-assembled monolayer (SAM) on the wall surfaces of the plurality of features to form the liner layer.

9. The method of claim 8, wherein the SAM comprises one or more monolayers.

10. The method of claim 8, wherein the SAM exhibits electroneutrality at the pH value of the etch solution.

11. The method of claim 2, further comprising adjusting the pH value of the etch solution to ensure that the liner layer exhibits the neutral surface charge at the pH value of the etch solution.

12. The method of claim 2, further comprising adding a surfactant to the etch solution to ensure that the liner layer exhibits the neutral surface charge at the pH value of the etch solution.

13. The method of claim 1, wherein the plurality of features comprise high aspect ratio features having an aspect ratio greater than or equal to 5, and wherein when exposed to the etch solution, the liner layer prevents surface charge induced CD-dependent etching of the material deposited within the high aspect ratio features and enables the etch solution to provide the uniform etch rate of the material along a target etch depth of the high aspect ratio features.

14. A method of etching, the method comprising:
providing a patterned substrate having a plurality of features, wherein a critical dimension (CD) of the plurality of features is small compared to more planar areas of the patterned substrate;
forming a liner layer within the plurality of features before the plurality of features is filled with a material to be etched;
depositing the material to be etched within the plurality of features and on the more planar areas of the patterned substrate; and
exposing the patterned substrate to an etch solution to etch the material deposited within the plurality of features and on the more planar areas of the patterned substrate, wherein the etch solution comprises a pH value;
wherein when exposed to the etch solution, the liner layer exhibits a neutral surface charge substantially equal to 0 mV at the pH value of the etch solution, and wherein the neutral surface charge prevents surface charge induced CD-dependent etching of the material deposited within the plurality of features and enables the etch solution to etch the material within the plurality of features and across the more planar areas of the patterned substrate at a uniform etch rate.

15. The method of claim 14, wherein if wall surfaces of the plurality of features were exposed to the etch solution, the wall surfaces of the plurality of features would exhibit a positive surface charge greater than 0 mV or a negative surface charge less than 0 mV at the pH value of the etch solution, which would cause the surface charge induced CD-dependent etching of the material deposited within the plurality of features.

16. The method of claim 14, wherein said forming the liner layer comprises depositing a material onto wall surfaces of the plurality of features to form the liner layer, wherein a thickness of the material deposited onto the wall surfaces is less than or equal to 5 nm.

17. The method of claim 16, wherein the material deposited onto the wall surfaces of the plurality of features: (a) is not etched by the etch solution, and (b) exhibits electroneutrality at the pH value of the etch solution.

18. The method of claim 14, wherein said forming the liner layer comprises forming one or more self-assembled monolayers (SAMs) on wall surfaces of the plurality of features to form the liner layer.

19. The method of claim 18, wherein the one or more SAMs exhibit electroneutrality at the pH value of the etch solution.

20. The method of claim 14, further comprising adjusting the pH value of the etch solution to ensure that the liner layer exhibits the neutral surface charge at the pH value of the etch solution.

21. The method of claim 14, further comprising adding a surfactant to the etch solution to ensure that the liner layer exhibits the neutral surface charge at the pH value of the etch solution.

22. The method of claim 14, wherein the plurality of features comprise high aspect ratio features having an aspect ratio greater than or equal to 5, and wherein when exposed to the etch solution, the liner layer exhibits the neutral surface charge, which prevents surface charge induced CD-dependent etching of the material deposited within the high aspect ratio features and enables the etch solution to provide the uniform etch rate of the material along a target etch depth of the high aspect ratio features.

* * * * *